(12) United States Patent
Asaba

(10) Patent No.: US 7,551,117 B2
(45) Date of Patent: Jun. 23, 2009

(54) ALL-WEATHER RADIO WAVE ABSORBER HAVING REFLECTOR AND OBJECT INTO WHICH SUCH ABSORBER IS INTEGRATED

(75) Inventor: Takahito Asaba, Tama (JP)

(73) Assignee: Ubiquitous Environment Company, Tokyo (JP)

( * ) Notice: Subject to any disclaimer, the term of this patent is extended or adjusted under 35 U.S.C. 154(b) by 75 days.

(21) Appl. No.: 11/918,200

(22) PCT Filed: Apr. 12, 2005

(86) PCT No.: PCT/JP2005/007070

§ 371 (c)(1),
(2), (4) Date: Oct. 10, 2007

(87) PCT Pub. No.: WO2006/112001

PCT Pub. Date: Oct. 26, 2006

(65) Prior Publication Data

US 2009/0021416 A1    Jan. 22, 2009

(51) Int. Cl.
*H01Q 17/00* (2006.01)
(52) U.S. Cl. .................................. 342/1; 342/3; 342/4
(58) Field of Classification Search ................ 342/1–4
See application file for complete search history.

(56) References Cited

U.S. PATENT DOCUMENTS

| | | | |
|---|---|---|---|
| 6,514,428 B2 * | 2/2003 | Suzuki et al. ................. 252/74 |
| 6,683,246 B2 * | 1/2004 | Hashimoto et al. .......... 174/394 |
| 6,869,683 B2 * | 3/2005 | Sakurai et al. ............... 428/448 |
| 2003/0044623 A1 * | 3/2003 | Sakurai et al. ............... 428/447 |
| 2003/0079893 A1 * | 5/2003 | Hashimoto et al. ...... 174/35 MS |
| 2009/0021416 A1 * | 1/2009 | Asaba ............................. 342/4 |

FOREIGN PATENT DOCUMENTS

| | | | |
|---|---|---|---|
| DE | 4012782 A | * | 10/1991 |
| JP | 62-62497 | | 4/1987 |
| JP | 8-3034277 | | 11/1996 |
| JP | 2001-94287 | | 4/2001 |
| JP | 2002-20994 | | 1/2002 |
| JP | 2002026569 A | * | 1/2002 |
| JP | 2002-57486 | | 2/2002 |
| JP | 2004-207506 | | 7/2004 |
| JP | 2005086022 A | * | 3/2005 |
| JP | 2007288765 A | * | 11/2007 |

* cited by examiner

*Primary Examiner*—John B Sotomayor
(74) *Attorney, Agent, or Firm*—James Creighton Wray

(57) ABSTRACT

The present invention provides an all-weather radio wave absorber having reflector capable of smoothly attenuating harmful microwave or millimeter wave from 400 MHz to 100 GHz generated from various electronic devices so that bad effects on human body or electronic device can be eliminated. The all-weather radio wave absorber having reflector comprises a laminated radio wave absorbing composite comprising a foamed upper radio wave absorber 1 with a rugged surface or a flat surface including conductive particles such as carbon particles, ferrite particles or the like in continuous foams 2 formed therein, one or more foamed intermediate planar radio wave absorbers 3 including conductive particles such as carbon particles 7, ferrite particles or the like in continuous foams 2 formed therein, a thin radio wave reflector 4 at the bottom, and a flexible cover for wrapping the laminated absorbers and reflector together. The laminated absorbing composite can absorb and attenuate radio waves from every direction, can reflect remaining radio waves by the reflector 4 and can absorb reflected radio waves by the absorber, so that static electricity generated on clothes is eliminated by the radio wave absorbing composite.

3 Claims, 7 Drawing Sheets

(a)

(b)

(a)

(b)

(a)

(b)

(c)

(a)

(b)

ALL-WEATHER RADIO WAVE ABSORBER HAVING REFLECTOR AND OBJECT INTO WHICH SUCH ABSORBER IS INTEGRATED

This application claims the benefit of PCT/JP2005/007070 filed Apr. 12, 2005, which is hereby incorporated by reference in its entirety.

FIELD OF INVENTION

The present invention relates to an all-weather radio wave absorber having reflector and also relates to an object to which such radio wave absorber having reflector is applied for reducing or preventing various radio waves scattering in the air and for eliminating static electricity which tends to be accumulated on the human body.

RELATED BACKGROUND ARTS

The 21st century led by advancing IC technologies, is called a radio wave environmental era, where various radio waves (from a microwave to a millimeter wave) are scattering in the air. More specifically, radio waves are scattering everywhere. Such radio waves are generated from sources outdoors such as mobile phones, PC wire-less LAN, IC tags, ITS and the like, and sources indoors such as wire-less telephones and the like. Recently, electromagnetic interference, radio wave interference and the like caused by IC net, have been widely talked about from the viewpoint of human health.

Under these circumstances, Japanese laid open patent No. 7-283577 (hereinafter referred as reference 1) discloses a three layered radio wave absorber comprising a radio wave absorbing layer, a metal foil layer for reflecting radio wave and a flexible magnet layer consisting of multi-polar magnets, and Japanese laid open patent No. 2002-57486 (hereinafter referred as reference 2) discloses a layered radio wave absorber for absorbing radio wave and/or electromagnetic wave comprising two or more radio wave absorbing layers, a heat transfer layer for converting absorbed waves into heat and intermediate layers for adhere above-mentioned layers.

DISCLOSURE OF THE INVENTION

Problems to be Solved by the Invention

For absorbing radio waves, the radio wave absorber disclosed in reference 1 employs the flexible magnet layer and the radio wave absorber disclosed in reference 2 has a layered structure comprising the heat transfer layer with a good radiating property and a high conductance is arranged. However, it is impossible for these absorbers to attenuate radio waves to a degree such that attenuated radio waves influence on the human body and other electronics devices not so gravely, for example, to attenuate by more than 15 dB over a wide range of frequencies from 400 MHz to 100 GHz.

The present invention is carried out in view of the above-mentioned problem in order to provide an all-weather radio wave absorber having reflector for reflecting and absorbing scattered radio waves in the air effectively, which has a desired form such as a block form, a sheet form or the like. And the all-weather radio wave absorber having reflector by the present invention can be integrated into various apparatuses, devices, furniture and the like.

Further the present invention provides an all-weather radio wave absorber having reflector capable of eliminating static electricity generated in clothes and preventing such static electricity from accumulating on the human body. Naturally, the present invention also provides objects into which the all-weather radio wave absorber having reflector is integrated.

Means to Solve the Problems

The above-mentioned problems are solved by the methods or apparatuses specified as follows.

(1) An all-weather radio wave absorber having reflector comprising: a laminated radio wave absorbing composite, the laminated radio wave absorbing composite comprising: a foamed upper radio wave absorber body with a rugged surface or a flat surface including conductive particles such as carbon particles or ferrite particles in continuous foams formed therein; one or more foamed intermediate planar radio wave absorbers including conductive particles such as carbon particles or ferrite particles in continuous foams therein; a thin radio wave reflector at the bottom; and a flexible cover for wrapping the laminated radio wave absorbing composite, wherein: radio waves from every direction are absorbed and attenuated by the radio wave absorbers; remaining radio waves are reflected by the radio wave reflector; reflected radio waves are absorbed and attenuated by the radio wave absorbers, and static electricity generated on clothes is eliminated by the laminated radio wave absorbing composite.

(2) The all-weather radio wave absorber having reflector according to (1), wherein: the upper radio wave absorber and the intermediate radio wave absorbers, or the intermediate radio wave absorbers and the bottom radio wave reflector are formed into a mono-block radio wave absorbing composite.

(3) The all-weather radio wave absorber having reflector according to (1), wherein: the rugged surface of the upper radio absorber is formed in continuous or discontinuous convex or wave formed protrusions.

(4) An object into which the all-weather radio wave absorber having reflector according to (1) or (3) is integrated.

(5) The object according to (4), wherein: the object includes toys such as dolls, buildings, furniture, vehicles and clothes, which are fixed or removable.

Effects Attained by the Invention

Since the upper radio wave absorber by the present invention has a rugged surface, the absorber can absorb radio waves from every direction such that carbon particles dispersed in the absorber effectively absorb harmful radio waves from every direction. Further, since one or more layered intermediate radio wave absorbers are arranged under the upper absorber, even strong radio waves can be absorbed stepwise. Remaining radio waves which pass through the layered intermediate absorbers are reflected by a radio wave reflector arranged in a bottom part. And reflected radio waves passing upward are absorbed by the layered intermediate absorbers and the upper absorber, so that the absorbed and reflected radio waves are attenuated to an almost harmless level against the human body, for example, by more than 15 dB.

Any of the all-weather radio wave absorbers having reflectors which have good attenuating effects specified by claims 1 to 5, can be integrated into any toy such as dolls. Further the absorbers having reflectors by the present invention can be attached to outsides of: or integrated into insides of: electronic apparatuses such as personal computers, various building parts, furniture such as desks, chairs, sofas, partitions and the like, structural members for cars such as seats, roofs, doors and floors, seats for trains, structural members for airplanes such as cockpits, seats, ceilings and floors, structural members for houses such as floors, walls and ceilings. The absorbers having reflector by the present invention can be fixed to or removable from the above-mentioned parts.

BRIEF DESCRIPTION OF THE DRAWINGS

FIG. 3(a) is a cross-sectional view of a car seat to which the absorber having reflector by the present invention is applied.

PREFERRED EMBODIMENTS BY THE PRESENT INVENTION

Hereinafter preferred embodiments by the present invention are explained in detail as referring to drawings.

Embodiment 1

FIGS. 1(a), 1(b) and FIGS. 2(a), 2(b), 2(c) show the two embodiments by the present invention.

Figure 1:
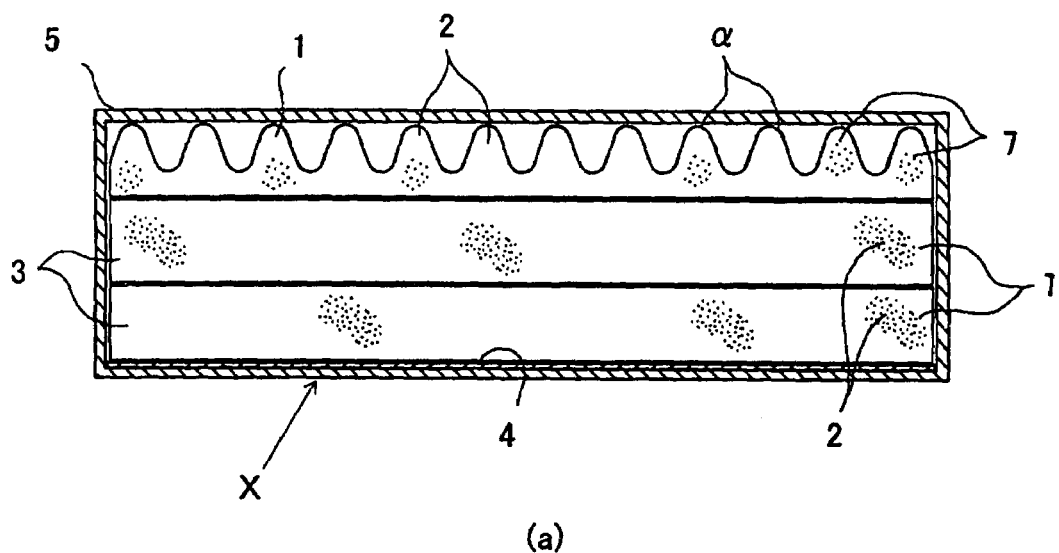
FIGS. 1(a) and 1(b) are cross-sectional side views of two embodied absorbers having reflectors by the present invention.
Figure 1:
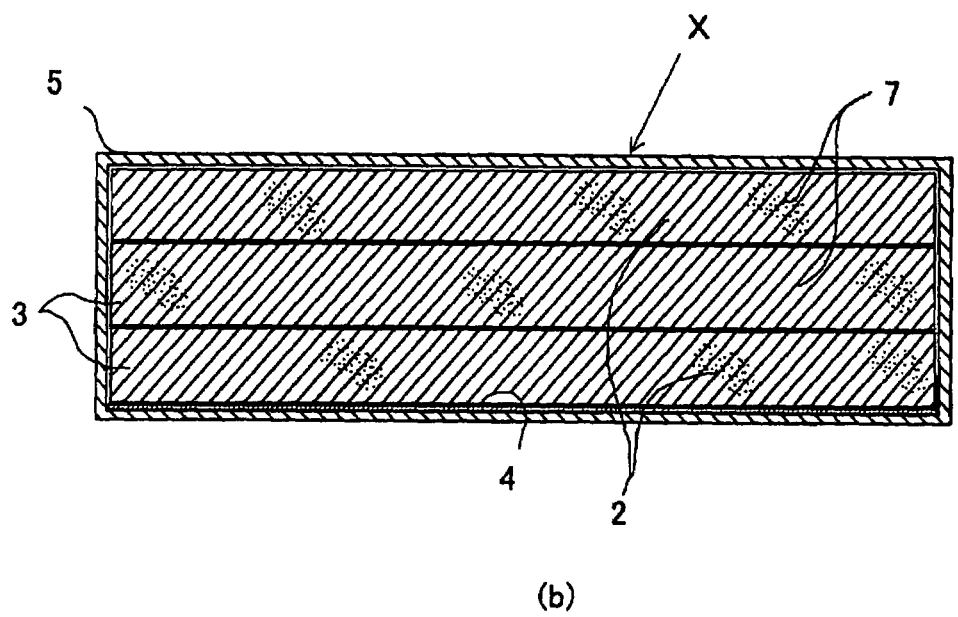

A reference numeral "1" in FIG. 1(a) is an upper radio wave absorber formed out of, for example, elastic foamed polyurethane in which continuously (porous) foamed portions 2 are formed. The upper absorber has a rugged shape surface α such as a convex surface, a corrugated surface or the like. Fine conductive carbon particles 7 are impregnated and fixed in the foamed portions 2. A reference numeral "3" is two or more foamed intermediate planar radio wave absorbers arranged beneath the upper radio wave absorber 1. The intermediate absorbers 2 have the same internal structure as the upper absorber 1. In other words, the intermediate absorber 2 has continuously foamed portions 2 and fine conductive carbon particles 7 are impregnated and fixed in the foamed portions 2.

Remarkable radio wave absorbing effects are attained by a composite layer consisting of the upper radio wave absorber 1 and the intermediate planar radio wave absorbers 3.

A reference numeral "4" is a planar radio wave reflector. The reflector can be made of, for example, an aluminum foil having a thickness from 50 to 100 μm and a unit weight of 6 kg/m² or nonwoven fabric which has electromagnetic shielding effects. It is preferable to employ fabric which does not include any halogen compounds from an ecological viewpoint. It is more preferable to employ nonwoven fabric having a fire retardant property.

Figure 2:
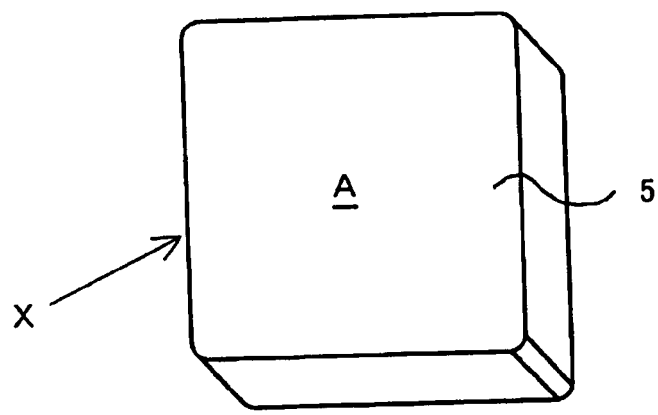
FIGS. 2(a), 2(b) and 2(c) are perspective views of the absorbers having reflectors with different sizes or shapes shown in FIG. 1
Figure 2:
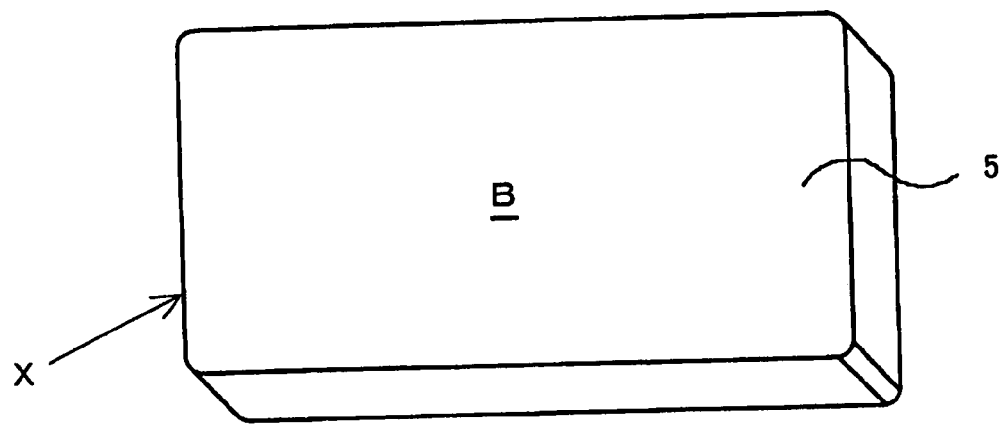
Figure 2:
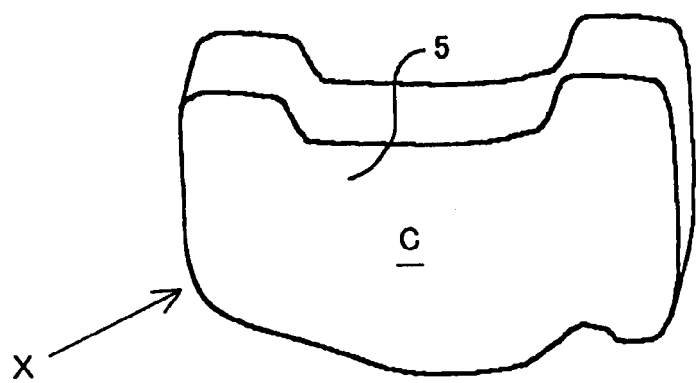

A reference numeral "5" is a cover for covering the external surfaces of the absorbers and the reflector. The cover 5 wraps the absorbers and the reflector so that a wrapped radio wave absorbing composite X is formed. The wrapped radio absorbing composite X illustrated in FIG. 2(a) is a square plate A having dimensions of, for example, 30 cm by 30 cm with a thickness of 8.5 mm. These dimensions can be varied from several centimeters to several meters in accordance with employed conditions. A thickness of the square plate A should be 6 cm to 8.5 cm taking radio wave absorbing effects into consideration. But the thickness can be varied from 2 cm to 6 cm in accordance with required conditions. The radio wave absorbing composite X can be formed in a rectangular plate B having dimensions, for example, 30 cm by 60 cm by 8.5 cm as shown in FIG. 2(b). Dimensions of the rectangular plate B can be varied as in the case of square plate A. The cover 5 can be formed out of flexible sheet materials such as synthetic leather, synthetic resin and the like as well as the above-mentioned fabric. The cover 5 can be formed in a desired form such as a circle, a globe, an oval or the like. FIG. 2(c) shows an irregularly shaped plate C which can be molded in a desired form.

Figure 3:
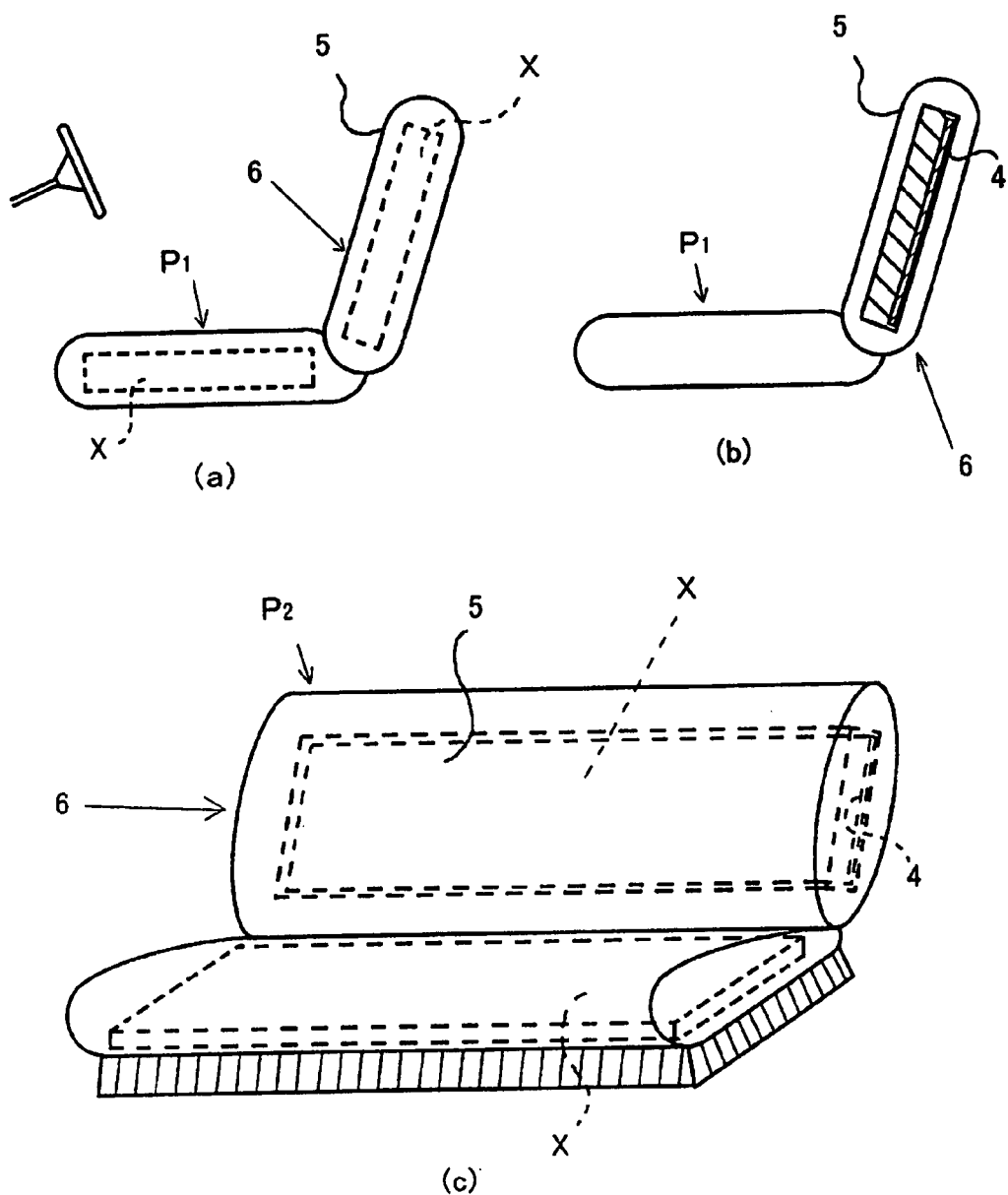
FIGS. 3(a), (b) and 3(c) are schematic views of seats or couches.
FIG. 3(b) is a cross-sectional view of a car seat with which the absorber having reflector by the present invention is integrated in accordance with a design of a backrest of the seat.
FIG. 3(c) is a perspective view of a couch to which the absorber having reflector by the present invention.

FIGS. 3(a) and 3(b) show seat $P_1$ for car. In these seats $P_1$, the wrapped radio wave absorber composites X illustrated in FIGS. 1(a) and 1(b) are wrapped by and accommodated in the backrests. Bare radio wave absorber composites, namely, radio wave absorber composites X without cover 5, can be directly arranged in or attached to any place of the seat $P_1$, in a ceiling, doors, a floor of the car and the like. As shown FIG. 1(c), the wrapped radio wave absorber composite X illustrated in FIGS. 1(a) and 1(b) can be arranged in a backrest of a sofa $P_2$. As in the case of the car seat, the bare radio wave absorber composite can be directly arranged in a backrest of the sofa $P_2$.

Figure 4:
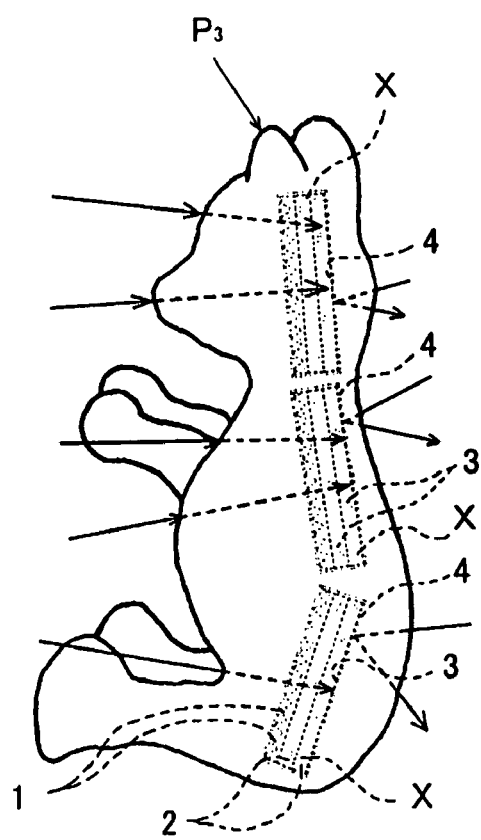
FIGS. 4(a) and 4(b) are cross-sectional side views of stuffed dolls to which the absorbers having reflectors by the present invention are applied.
Figure 4:
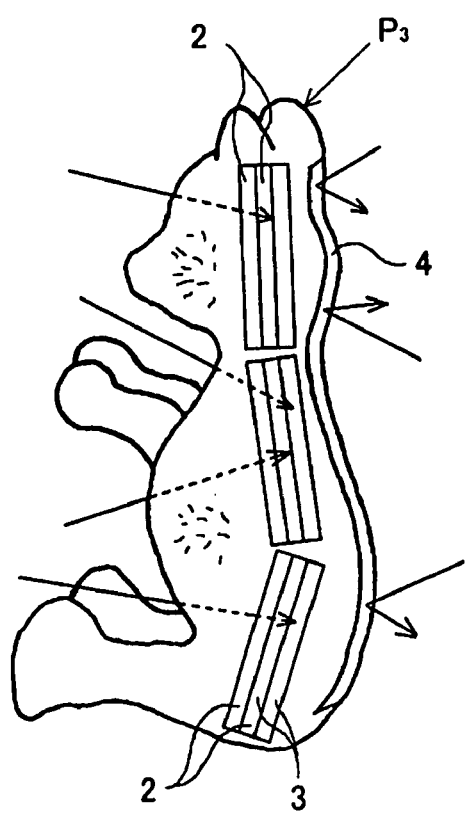

As illustrated FIG. 4(a), the radio wave absorber composite X comprising the upper absorber 1 with the rugged shape α on its surface, one or more intermediate planar radio wave absorbers 3 and the planar radio wave reflector 4 at the bottom, is arranged in a stuffed doll $P_3$ as wrapped or after removing the cover 5.

FIG. 4(b) shows the stuffed doll $P_3$ in which only one or more intermediate radio wave absorbers are arranged and planar radio wave reflector 4 is separately attached to the back of the stuffed doll $P_3$.

Figure 5:
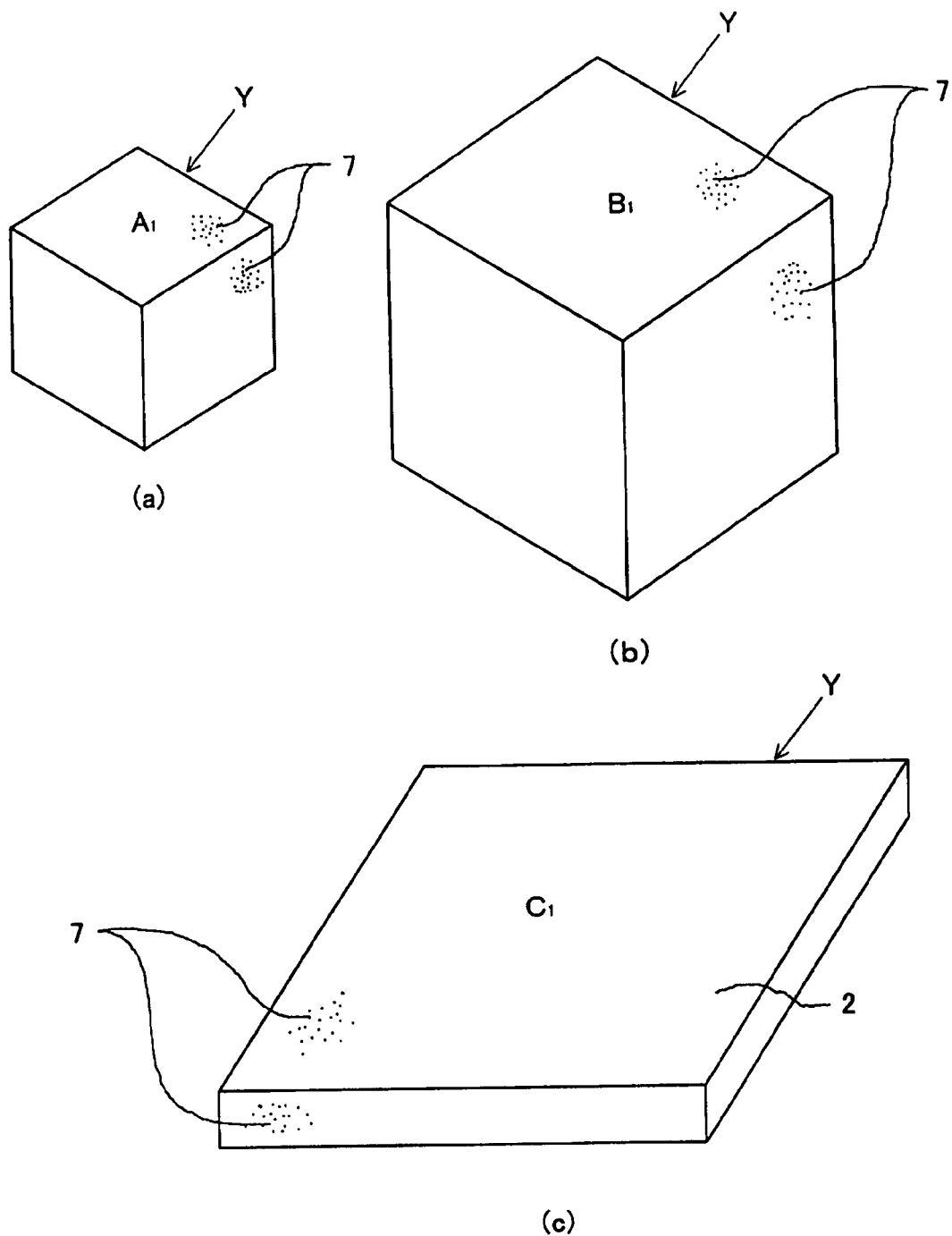
FIGS. 5(a), 5(b) and 5(c) are the absorbers having reflector formed into block shapes for various uses.

FIGS. 5(a) and 5(b) respectively illustrate a cubic absorber composite $A_1$ (small one) and other cubic absorber composite $B_1$ (large one). FIG. 5(c) illustrates a planer absorber composite $C_1$.

These absorber composites are modified from the absorber composites X illustrated in FIGS. 2(a), 2(b) and 2(c), such that one or more intermediate radio wave absorbers 3 are formed into a foamed polyurethane mono-block without employing the upper radio absorber 1. Conductive carbon particles 7 or ferrite particles are filled in continuously foamed portions 2 of the intermediate absorbers 3 which can be wrapped or not by the cover 5. In FIGS. 5(a) to 5(c), bare (i.e. not wrapped) absorber composites Y are illustrated. The radio wave reflector 4 such as aluminum foil can be attached to or not attached to the absorber composite Y.

Figure 6:
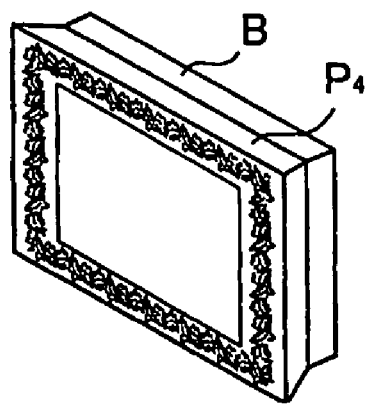
FIG. 6 is a perspective view of a frame to which the absorber having reflector by the present invention is applied.

In FIG. 6, a frame $P_4$ is backed by the rectangular radio wave absorbing composite B illustrated in FIG. 2(b). In this case, strings or hook and loop fasteners (Velcro®) are arranged on both side of the absorbing composite B, so that the absorbing composite B can be attached to or detached from adhering parts formed on the frame $P_4$ beforehand.

Figure 7:
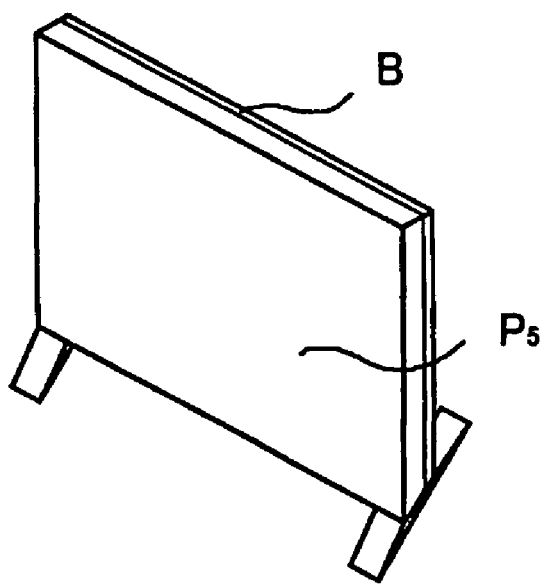
FIG. 7 is a perspective view of a partition to which the absorber having reflector is applied.

FIG. 7 shows a partition $P_5$ to which the rectangular radio wave absorbing composite B illustrated in FIG. 2(b) is attached in the same way as in the case of the frame shown in FIG. 6 by utilizing strings or hook and loop fasteners (Velcro®), or by employing magnets so that the radio wave absorbing composite B can be easily attached to the partition $P_5$.

Figure 8:
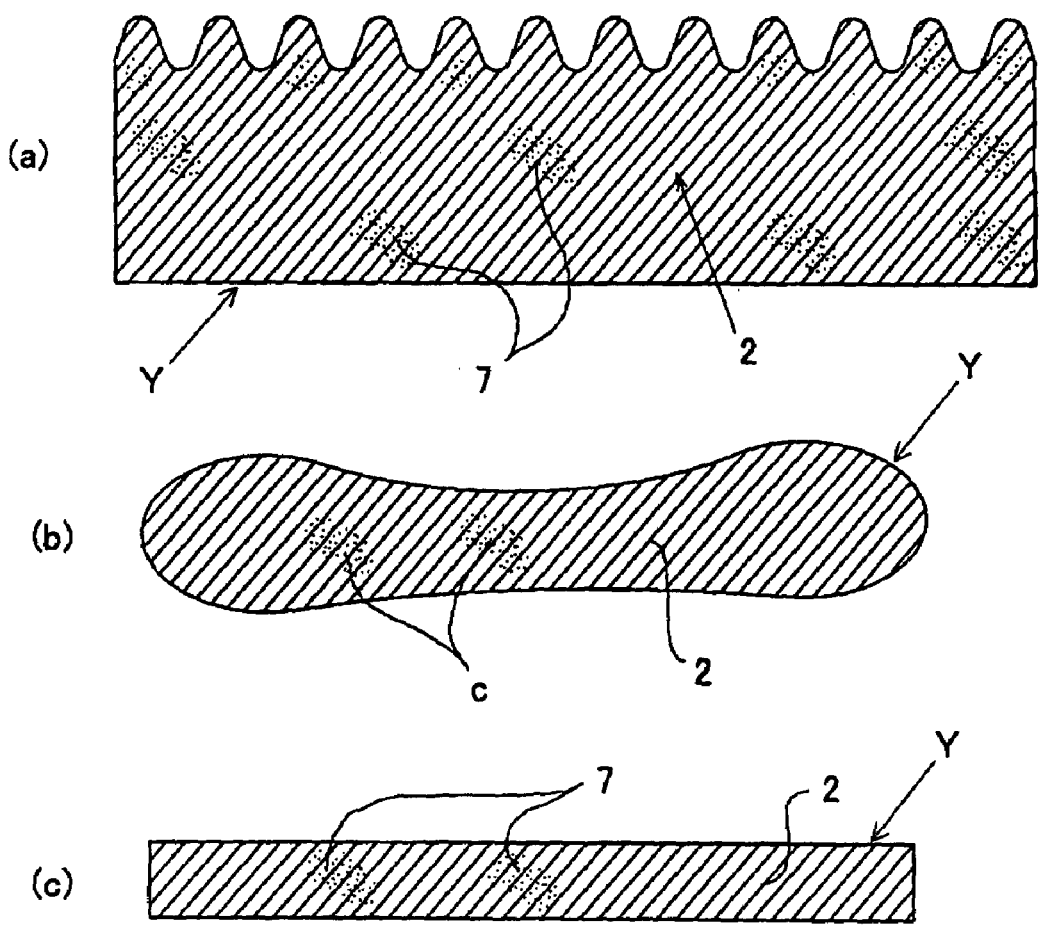
FIGS. 8(a), 8(b) and 8(c) are cross-sectional side views of molded mono-block absorbers by the present invention.

FIGS. 8(a), 8(b) and 8(c) show molded mono-block absorbers Y. The molded mono-block absorber Y in FIG. 8(a) corresponds to the radio wave absorbing composite X without the cover 5 in FIG. 1(a). The molded mono-block absorber Y in FIG. 8(b) is formed in a cushion shape and the molded mono-block absorber Y is formed in a plate. These absorbers Y formed out of foamed polyurethane. The conductive fine carbon particles 7 or ferrite fine particles are impregnated and fixed in continuous foams 2 of the foamed polyurethane, and the planar radio wave reflectors 4 can be attached to the bottom of the composites Y in accordance with required conditions. Since conductive materials are included in these radio wave absorbers Y, static electricity is not generated on clothes of a person who uses these absorbers Y, so that comfortable living environments can be attained.

Industrial Applicability

Harmful radio waves in a range from microwave to the millimeter wave generated from various electronic or electric devices can be effectively attenuated by a radio wave absorbing composite comprising foamed polyurethane and carbon particles or ferrite particles included in the foamed polyurethane, so that radio waves from 800 MHz to 100 GHz can be remarkably attenuated by 15 dB. Further the radio wave reflecting plate formed out of the metal foil arranged at the bottom of the absorbing composite reflects remaining radio waves and reflected radio waves are absorbed by the radio wave absorbing composite. When the radio wave absorbing composites are applied to furniture, static electricity generated from clothes or human bodies is conducted to the radio wave absorbing composites, so that safe and good living environment can be attained by the radio wave absorbing composite by the present invention.

What is claimed is:

1. An all-weather radio wave absorber having reflector comprising:
    a laminated integrated radio wave absorbing composite, said laminated integrated radio wave absorbing composite comprising:
    a continuous or discontinuous foamed upper radio wave absorber body with a convex rugged surface or a corrugated surface including conductive particles such as carbon particles or ferrite particles in continuous foams formed therein;
    one or more foamed intermediate planar radio wave absorbers including conductive particles such as carbon particles or ferrite particles in continuous foams therein arranged beneath said upper radio wave absorber and;
    a thin radio wave reflector arranged at the bottom of a lowermost absorber of said intermediate radio wave absorbers, wherein:
    a flexible cover wraps said laminated radio wave absorbing composite;
    a wide range of radio waves with frequencies from 800 MHz to 100 GHz scattering from every direction are absorbed and attenuated by 15 dB by said radio wave absorbers;
    remaining radio waves are reflected by said radio wave reflector;
    reflected radio waves are absorbed and attenuated by said radio wave absorbers, and
    static electricity generated on clothes is eliminated by said laminated radio wave absorbing composite.

2. An object into which said all-weather radio wave absorber having reflector according to claim 1 is integrated.

3. The object according to claim 2, wherein:
    said object includes toys such as dolls, buildings, furniture, vehicles and clothes, which are fixed or removable.

* * * * *